United States Patent [19]

Grandguillot et al.

[11] Patent Number: 4,529,896
[45] Date of Patent: Jul. 16, 1985

[54] TRUE/COMPLEMENT GENERATOR EMPLOYING FEEDBACK CIRCUIT MEANS FOR CONTROLLING THE SWITCHING OF THE OUTPUTS

[75] Inventors: Michel Grandguillot, Mennecy; Pierre Mollier, Boissise; Jean-Paul Nuez, Mennecy, all of France

[73] Assignee: International Business Machines Corporation, Armonk, N.Y.

[21] Appl. No.: 448,135

[22] Filed: Dec. 9, 1982

[30] Foreign Application Priority Data

Mar. 24, 1982 [EP] European Pat. Off. ........ 82430009.9

[51] Int. Cl.³ .................... H03K 5/15; H03K 19/088; H03K 19/20
[52] U.S. Cl. .................................. 307/480; 307/443; 307/456; 307/269; 307/601; 328/55; 328/57; 328/155
[58] Field of Search ............... 307/443, 446, 456, 463, 307/480, 362, 363, 542, 262, 269, 591, 601, 605; 328/55, 57, 105, 155

[56] References Cited

U.S. PATENT DOCUMENTS

| | | | |
|---|---|---|---|
| 3,222,547 | 12/1965 | Boan et al. | 307/454 |
| 3,535,644 | 10/1970 | Slayden et al. | 328/110 |
| 3,654,490 | 4/1972 | Kan | 307/262 X |
| 3,668,436 | 6/1972 | Bacon | 328/57 X |
| 3,902,082 | 8/1975 | Proebsting et al. | 307/279 |
| 3,914,628 | 10/1975 | Pao et al. | 307/270 |
| 3,927,334 | 12/1975 | Callahan | 307/269 |
| 3,986,046 | 10/1976 | Wunner | 307/446 X |
| 4,130,768 | 12/1978 | Bula et al. | 307/270 |
| 4,140,927 | 2/1979 | Feucht | 307/262 |
| 4,201,927 | 5/1980 | Zuk | 307/269 |
| 4,228,371 | 10/1980 | Mazgy | 307/270 X |
| 4,424,455 | 1/1984 | Neely | 307/446 X |

OTHER PUBLICATIONS

"Dynamic Mosfet Logic Clock Driver", B. Cassidy et al., vol. 22, No. 3, Aug. 1979, IBM Technical Disclosure Bulletin.

"True-Complement Generator" by S. D. Koutos et al., IBM Technical Disclosure Bulletin, vol. 14, No. 11, Apr. 1972, p. 3244.

"In-Line Word Address True/Complement Generator" by A. Denis et al., IBM Technical Disclosure Bulletin, vol. 24, No. 4, Sep. 1981, p. 2209.

Publication No. 0024496 of the European Patent Application filed on Jun. 24, 1980 (Publication No. 0024496 Corresponds to U.S. patent application Ser. No. 179,210 entitled "Generator Circuit for Generating True/Complement Signals", filed 8/18/80 by Grandguillot et al., of common assignee and now abandoned.

Primary Examiner—Stanley D. Miller
Assistant Examiner—D. R. Hudspeth
Attorney, Agent, or Firm—Wesley DeBruin

[57] ABSTRACT

A true/complement generator for generating the complement and true value of weighted address bits, preventing an address decoder from selecting several lines at the same time. It comprises two circuits (1) and (2), the first one providing the true value ($\phi$), the second one providing the complement ($\bar{\phi}$) thereof. The means provided for preventing multiple selections from occurring, comprise in the first circuit, a transistor (T11-1) for delaying the rising edge of ($\phi$) as long as it is maintained on by the level provided by resistors R11-1 and R10-2 from output $\bar{\phi}$. Transistor T11-2 in the second circuit prevents $\bar{\phi}$ from going high as long as it is maintained on by the level provided by R10-1, R11-2 from $\phi$.

2 Claims, 5 Drawing Figures

TRUE/COMPLEMENT GENERATOR EMPLOYING FEEDBACK CIRCUIT MEANS FOR CONTROLLING THE SWITCHING OF THE OUTPUTS

FIELD OF THE INVENTION

This invention relates to a true/complement generator with feedback, which can be more particularly used, in an address decoder, for instance, for a memory.

BACKGROUND OF THE INVENTION AND PRIOR ART

There is a plurality of true/complement generating circuits used with a diode selecting array or a similar device, for selecting the word or bit lines of a memory array. These generators appear as quite satisfactory in numerous applications.

For instance, such a circuit is described in publication No. 0024496 of the European Patent Application filed on June 24, 1980. (Publication No. 0024496 corresponds to U.S. Patent Application Ser. No. 179,210 entitled "Generator Circuit For Generating True/Complement Signals" filed Aug. 18, 1980 by M. Grandguillot et al., of common assignee and now abandoned.)

There is a sizeable number of true/complement circuits known and used in the art. A very large number of patents and publications are directed to true/complement circuits. Merely by way of example: (1) U.S. Pat. No. 3,222,547 entitled "Self-Balancing High Speed Transistorized Switch Driver and Inverter" granted Dec. 7, 1965 to B. H. Boan et al; (2) U.S. Pat. No. 3,535,644 entitled "Pulse Amplitude and Width Detector" granted Oct. 20, 1970 to M. D. Slayden et al.; (3) U.S. Pat. No. 3,654,490 entitled "Gate Circuit with TTL Input and Complementary Outputs" granted Apr. 4, 1972 to D. T. Kan; (4) U.S. Pat. No. 3,914,628 entitled "T-T-L Driver Circuitry" granted Oct. 21, 1975 to Henry C. Pao et al.; (5) U.S. Pat. No. 4,228,371 entitled "Logic Circuit" granted Oct. 14, 1980 to J. D. Mazgy; (6) Publication entitled "True-Complement Generator" by S. D. Koutos et al., IBM Technical Disclosure Bulletin, Vol. 14, No. 11, April 1972, page 3244; and (7) Publication entitled "In-Line Word Address True/Complement Generator" by B. A. Denis et al., IBM Technical Disclosure Bulletin, Vol. 24, No. 4, September 1981, page 2209.

Since the read and write cycles of the memory arrays are now shorter and shorter, said known circuits show a drawback which is due to the fact that the true and at complement outputs thereof change the same time. As a matter of fact, in order to select a word line amongst $2^n$ lines in a memory array, one uses a diode decoder to which address signals are applied by means of n true/complement generators. In such an arrangement, undesired selections can appear each time the two outputs of one or more generators are simultaneously in a condition which does not ensure a deselection. This phenomenon will be explained in details with reference to FIGS. 1 and 2 of this application.

SUMMARY OF THE INVENTION

Therefore, an object of this invention is to provide a true/complement generating circuit which can be used with a diode decoder.

This invention relates to a true/complement generator which can be used for generating true and complement values of address bits, allowing lines to be addressed through a decoder comprising semiconductor devices. The decoder is comprised of an array of horizontal lines connected to the outputs of the generators. The inputs of true/complement generators receive the weighted address bits. The decoder also includes vertical lines which are to be selected. Each of the semiconductor devices for selecting a vertical line is connected to one of said vertical lines and to one of the two output lines of one of said generators.

The true/complement generator comprises a first and a second circuit. The first circuit receives the input signal and outputs the true value of said signal. It comprises delay control means responsive to a threshold generated from the output signal of the second circuit in order to delay the edge of its output signal which is of the same nature as the edge of the pulses which cause a selection to be performed. The second circuit receives the input signal and provides the complement of said input signal. The second circuit includes delay control means responsive to a threshold generated from the output signal of the first circuit in order to delay the edge of its output signal of the same nature as the edge of the pulses which cause a selection to be performed.

The first circuit comprises an input inverter circuit including a transistor the base of which receives the input signal and the collector of which provides the inverse of said input signal. The first circuit further including an output inverter output circuit having a control transistor the base of which is connected to the collector of the input inverter circuit transistor and a power output circuit responsive to the state of the control transistor in order to generate the true value of the input signal on the output of the first circuit. The delay control means of the first circuit comprising a transistor mounted in parallel with the control transistor. The base of the delay control means transistor being connected to the common node of a bridge comprised of two resistors mounted in series between the output of the second circuit and a reference voltage.

The second circuit comprises the same devices, namely an inverter output circuit similar to the output inverter circuit of the first circuit. The second circuit also includes a delay control means transistor mounted in parallel with a control transistor. The base of the delay control means transistor of the second circuit being connected to the common node of a bridge comprised of two resistors mounted in series between the output of the first circuit and a reference voltage.

BRIEF DESCRIPTION OF THE DRAWINGS

These and other objects, features and advantages of the invention will be apparent from the following more particular description of the preferred embodiments of the invention as illustrated in the drawings.

The invention will be described in detail below by means of an embodiment of the invention as illustrated in the drawings.

DETAILED DESCRIPTION OF THE PREFERRED EMBODIMENTS OF THE INVENTION

As a preliminary to the description of the circuit of this invention and with reference to FIG. 1, the problem to be resolved when a line is selected by a diode decoder, will be explained below.

The diode decoders are currently used, in particular for selecting a line in a memory array, for instance. Such a device is shown in FIG. 1.

For selecting $k=2^n$ lines L1, . . . , Lk with a diode decoder, n true/complement generators TCG1 to TCGn are required.

In the scheme shown as an example, three generators are provided for selecting eight lines.

Address signals A, B, C are applied to the inputs of the TCG generators which provide output signals a and $\bar{a}$, b and $\bar{b}$, c and $\bar{c}$, respectively.

The decoder in the array is comprised of the horizontal lines, which are the outputs of the TCG circuits and of the vertical lines which are the lines to be selected. The diodes being appropriately located at the intersections of the horizontal lines with the vertical lines, so that when a configuration of weighted address bits is applied to A, B and C, a line is selected by switching off the diodes associated therewith. For instance, when the 000 configuration is applied to A, B and C, $\bar{a}$, $\bar{b}$ and $\bar{c}$ are at 1 and line L1 is selected.

In such an array, undesired selections are experienced each time the two outputs of one, or several TCG circuits, are liable to be in a condition which does not deselect the previously selected line, when a new line is selected. This condition is experienced during the address change transients when the TCG true/complement generator shows a longer delay on the deselecting edge than on the selecting edge. This problem is of major importance in the diode decoders for which the decode array provides the circuit with a charge current which makes selection easier.

This phenomenon will be explained below with reference to FIG. 2.

Let us assume that line L1 is selected: A, B, C=0 and that line L2 is to be selected: A, B, C=100.

Figure 2A:
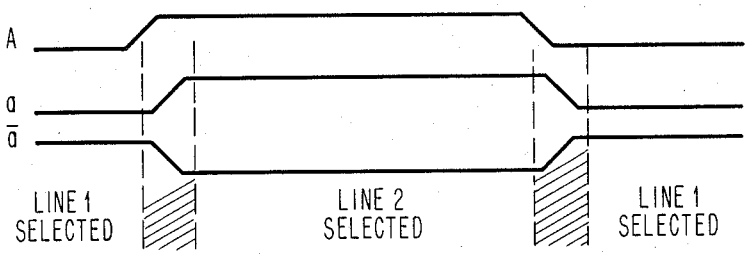
FIGS. 2A and 2B show the signals which cause multi-selection to be performed in the decode arrangements of the prior art.
Figure 2A:
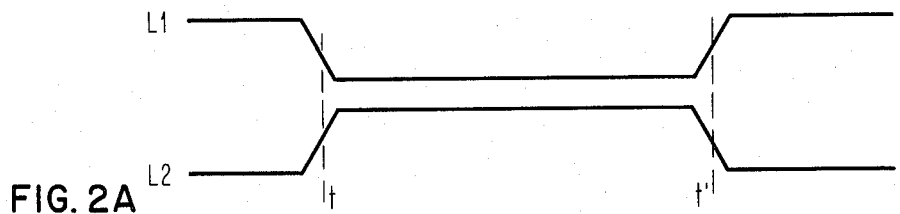

FIG. 2A shows the new condition of line A, a and $\bar{a}$ and the levels of lines L1 and L2.

On times t and t', when changing of level, two lines are selected: line L1 and line L2 since a and $\bar{a}$ are at an up level.

Figure 2B:
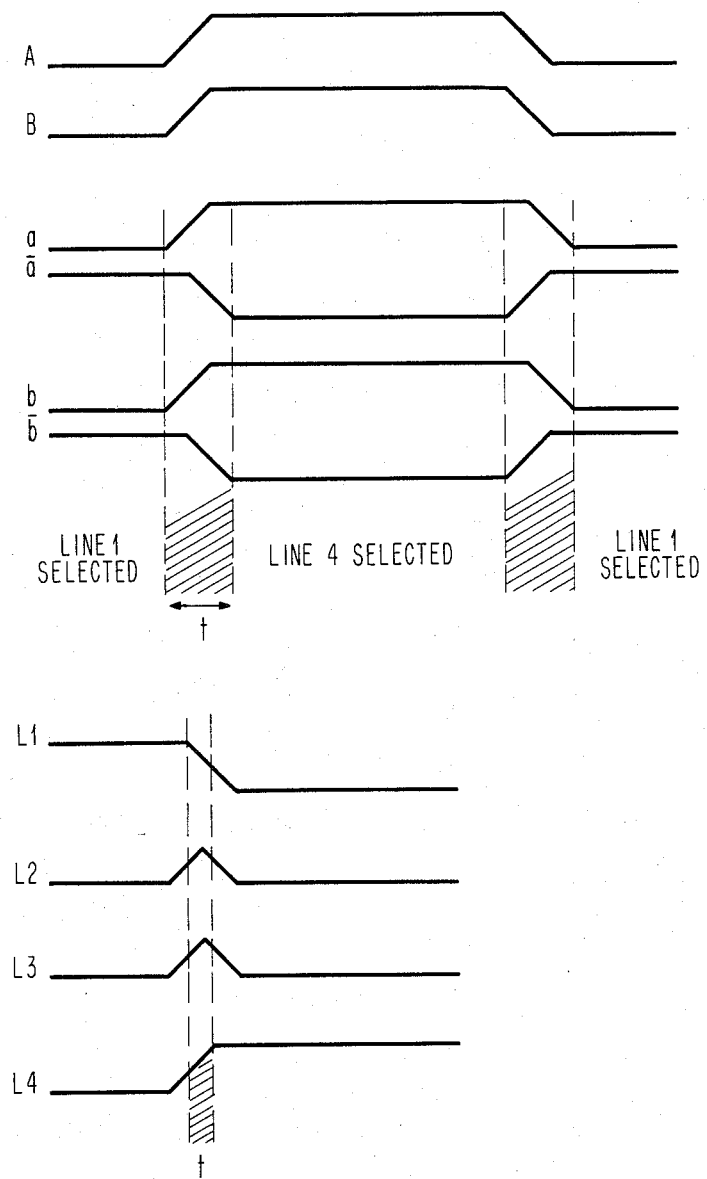

When two address bits change level, for instance when line L4 is to be selected and provided that line 1 was previously selected, i.e. that:

ABC changes from 000 to 110 during time t of the resulting transient period shown in FIG. 2B, there is a simultaneous selection of lines L1 and L4 and also, an undesired selection of lines 2 and 3.

The levels of lines L1, L2, L3 and L4 during this transient period, are shown in FIG. 2B.

In the case of a high density memory with $2^n$ lines, this phenomenon can become very detrimental since in the most unfavorable case in which all the address bits change level, all the lines are affected by said phenomenon, including the line which is selected and the one which is deselected.

The effects of this phenomenon will be explained below when the selection operation relates to the word lines of a read-only memory of the type described in publication No. 0030280 of the European Patent Application published on Nov. 14, 1980. (Publication No. 0030280 corresponds to U.S. Patent Application Ser. No. 213,288 entitled "Matrix Array of Semiconducting Elements" filed Dec. 5, 1980 by Michel G. Bauge et al, granted as U.S. Pat. No. 4,400,713 on Aug. 23, 1983, and of common assignee herewith.) This memory comprises an array of Txy transistors provided at the intersections of word lines WL with bit lines BL. FIG. 1 shows a portion of such an assembly connected to line L1.

Figure 1:
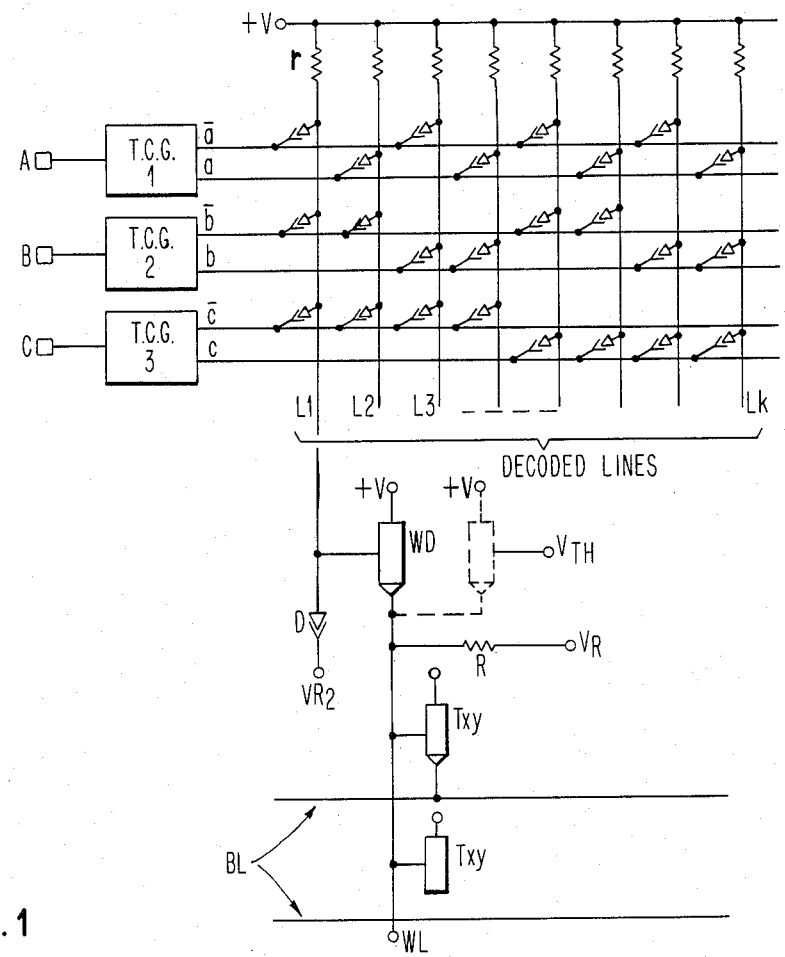
FIG. 1 shows a decode circuit in which the present invention can be implemented.

Two storage elements comprised of transistor Txy are shown on FIG. 1. The first transistor is provided with an emitter connected to bit line BL to represent a "1" and the second one has no emitter to represent a "0". Lines L1 and Lk are connected to the bases of control transisstors WD for selecting a word line WL. The emitters of transistors WD are connected to, to lines WL and through a resistor R to a reference voltage VR (for example, 1 volt), common to all the word lines since normally, only one transistor WD is conducting.

In such an assembly, during the transient periods, all the lines can be selected so that all transistors WD are conducting, which causes reference voltage VR to be unable to withstand the current which is $2^n$ times higher than the normal current. Therefore, all these word lines are very difficult to be deselected and the access time required to select the desired word line becomes very long.

In addition, diode D which connects the base of transistor WD to a reference voltage $VR_2$, for example 2 volts, in a preferred embodiment, does not stand the current provided by the $2^n$ resistors r of the decoder.

An arrangement to obviate this problem may consist of providing a voltage threshold ($V_{TH}$) between the decoder output (line L) and the memory select lines (word line WL) as shown in dashed lines in FIG. 1. As long as the spurious pulse on the base of WD remains under $V_{TH}$, there is no action on the memory. This arrangement is affected by several drawbacks, four of which are listed below.

1. It is necessary to provide an additional transistor between the cells which increases the interval between said cells, said interval being very small in the case of a ready-only memory since each cell comprises only one semiconductor device. The addition of such a transistor would take too much surface.
2. In addition, this transistor is permanently conducting current, which increases the dissipated power.
3. There is one more reference voltage to be distributed into the memory.
4. Selection is delayed when the selecting edge on the base of WD crosses the threshold.

According to this invention, the circuit used as a true/complement generator suppresses the spurious pulses of the decoder output lines. Output pulses $\phi$ and $\bar{\phi}$ of each generator are such that a phase can rise only if the output in opposite phase has already gone down to a certain threshold which is the total deselection threshold of a line.

Figure 3:
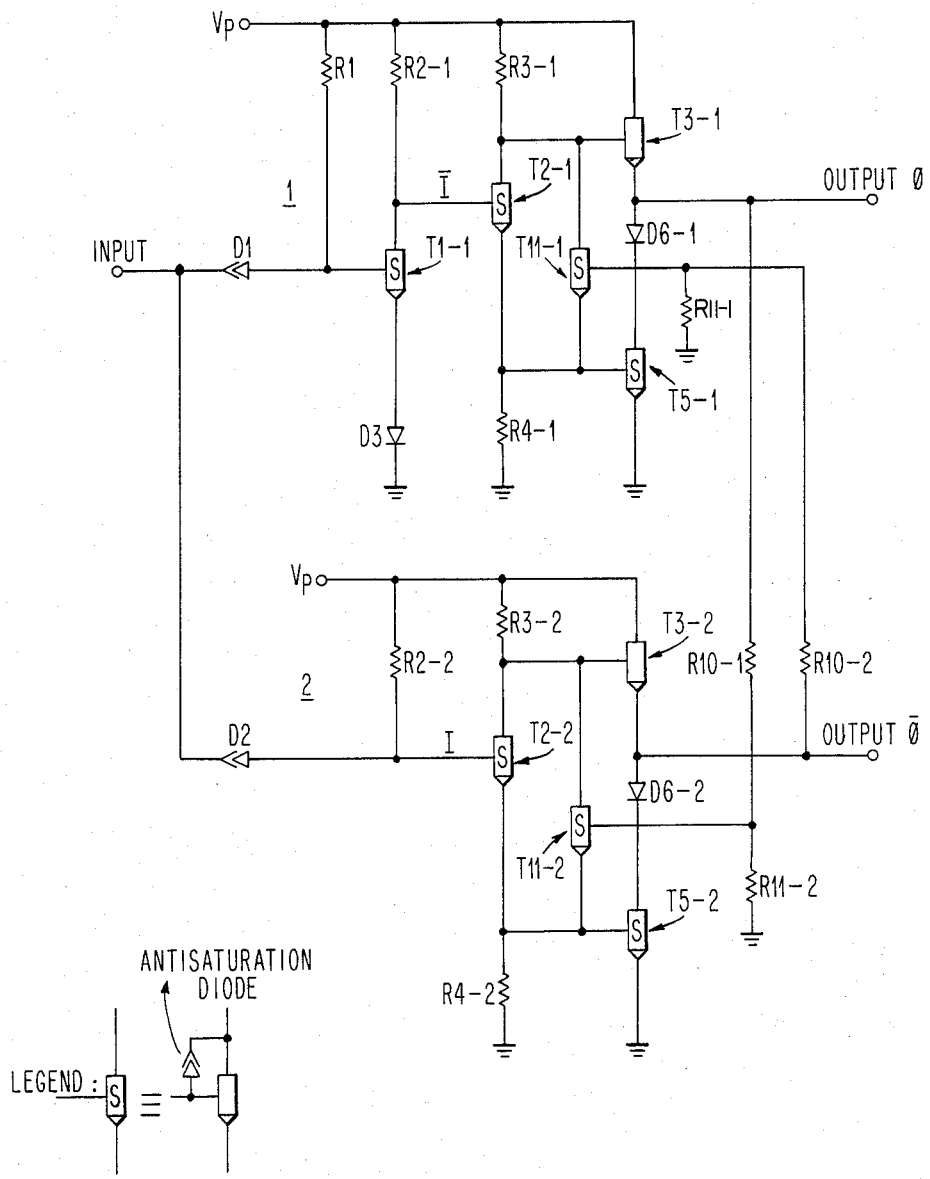
FIG. 3 shows a first embodiment of a true/complement generator in accordance with the invention.

As shown in FIG. 3, the input signal is applied to two circuits 1 and 2 of the generator by two diodes D1 and D2.

First circuit 1 includes an inverter comprised of transistor T1-1 the base and collector of which are connected to biasing voltage $V_p$ through two resistors R1 and R2-1. The emitter of T1-1 is grounded through diode D3. A signal $\bar{I}$ which is the inverse of the input signal, is generated on the collector of transistor T1-1. A signal I, in phase with the input signal, is impressed on the anode of diode D2 of circuit 2.

Each signal I and Ī controls a power circuit of the push-pull type.

In circuits 1 and 2 similar reference numbers are used to identify the elements performing the same functions. The suffixes "1" or "2" being respectively added to the reference number of the elements of circuits 1 and 2. Consequently, only one circuit is described in detail hereinafter, namely circuit 1.

The base of out-phasing transistor T2-1 receives signal Ī. Its emitter is grounded through a resistor R4-1 and its collector is connected to a biasing voltage $V_p$ through resistor R3-1.

The base of pull-up transistor T3-1 is connected to the collector of transistor T2-1. The collector of transistor T3-1 is connected to the biasing voltage and its emitter is connected to the collector of push transistor T5-1 through diode D6-1. The base of T5-1 is connected to the emitter of T2-1 and its emitter is grounded.

In phase output $\phi$ is taken from the emitter of transistor T3-1 and complement output $\bar{\phi}$ is taken from the emitter of T3-2.

A transistor T11-1 is mounted in parallel with T2-1. The collector of transistor T11-1 is connected to the collector of T2-1 and its emitter is connected to the emitter of T2-1.

The base of T11-1 is connected to the middle tap of a divider bridge comprising resistor R11-1 connected to the ground and resistor R10-2 connected to complement output $\bar{\phi}$ of circuit 2.

The circuit operates as follows:
1. With an up level input.
   T1-1 conducting, the T1-1 collector voltage is low, i.e. slightly above 1 $V_{BE}$, namely 1.0 volt in a preferred embodiment ($V_{BE}$ is the base-emitter voltage of a transistor).
   Transistor T2-1 is slightly conducting so as to transmit a base voltage lower than 1 $V_{BE}$ to transistor T5-1, which switches off said transistor.
   The collector voltage of transistor T2-1 is high (close to biasing voltage $V_p$), which causes T3-1 to conduct and output $\phi$ to go high. The voltage obtained by dividing this level through R10-1 and R11-2, is applied to the base of transistor T11-2 of circuit 2, which causes this transistor to conduct. Therefore, transistor T5-2 is on and transistor T3-2 is off, level $\bar{\phi}$ is low. This low output voltage is divided through R10-2 and R11-1 and applied to the base of transistor T11-1, which switches it off.
2. A falling transition is applied to the input.
   This transition tends to switch transistors T1-1 and T2-2 off. The off state of transistor T2-2 does not modify the state of transistor T3-2 and T5-2 as long as T11-2 is maintained on by the high level of true output $\phi$.
   T1-1 switches off, which switches transistor T2-1 on, which switches transistor T5-1 on and transistor T3-1 off. Output $\phi$ delivers a falling signal.
   When the level on output $\phi$ is sufficiently low, transistor T11-2 switches off, thus the voltage on the base of T3-2 rises and the base of transistor T5-2 is grounded through resistor R4-2. Therefore, transistor T5-2 switches off and the signal on complement output $\bar{\phi}$ begins to rise.

The signal on complement output $\bar{\phi}$ begins to rise only when the signal on true output $\phi$ has reached a threshold determined by R10-1, R11-2.

3. A rising transition from the previously obtained final status is applied to the input.

A process contrary to the previously described one, takes place. This rising transition switches transistors T1-1 and T2-2 on.

There is no change in the signal on true output $\phi$ as long as transistor T11-1 is maintained on by the high level on output $\bar{\phi}$ divided by R11-1, R10-2.

But the input signal will be transmitted by T2-2 to T3-2 and T5-2, which causes signal on complement output $\bar{\phi}$ to go down.

It is only when the voltage level on the base of T11-1 determined by R10-2 and R11-1 has reached the switching-off threshold value that true output $\phi$ is unlocked and able to rise. The sequencing is also obtained in this case.

The threshold which allows the output signal to rise can be easily adjusted by modifying the resistor ratio R10/(R11+R10) in circuits 1 and 2. This allows the sequencing of $\phi$ and $\bar{\phi}$ to be accurately adjusted and therefore, the delay to be improved depending upon the circuit controlled by these signals.

The adjustment range of the threshold defined by these resistors can be extended by connecting these bridges:
   either directly to the collector of transistors T5-1 and T5-2
   or to the base of T3-1 and T3-2.

Figure 4:
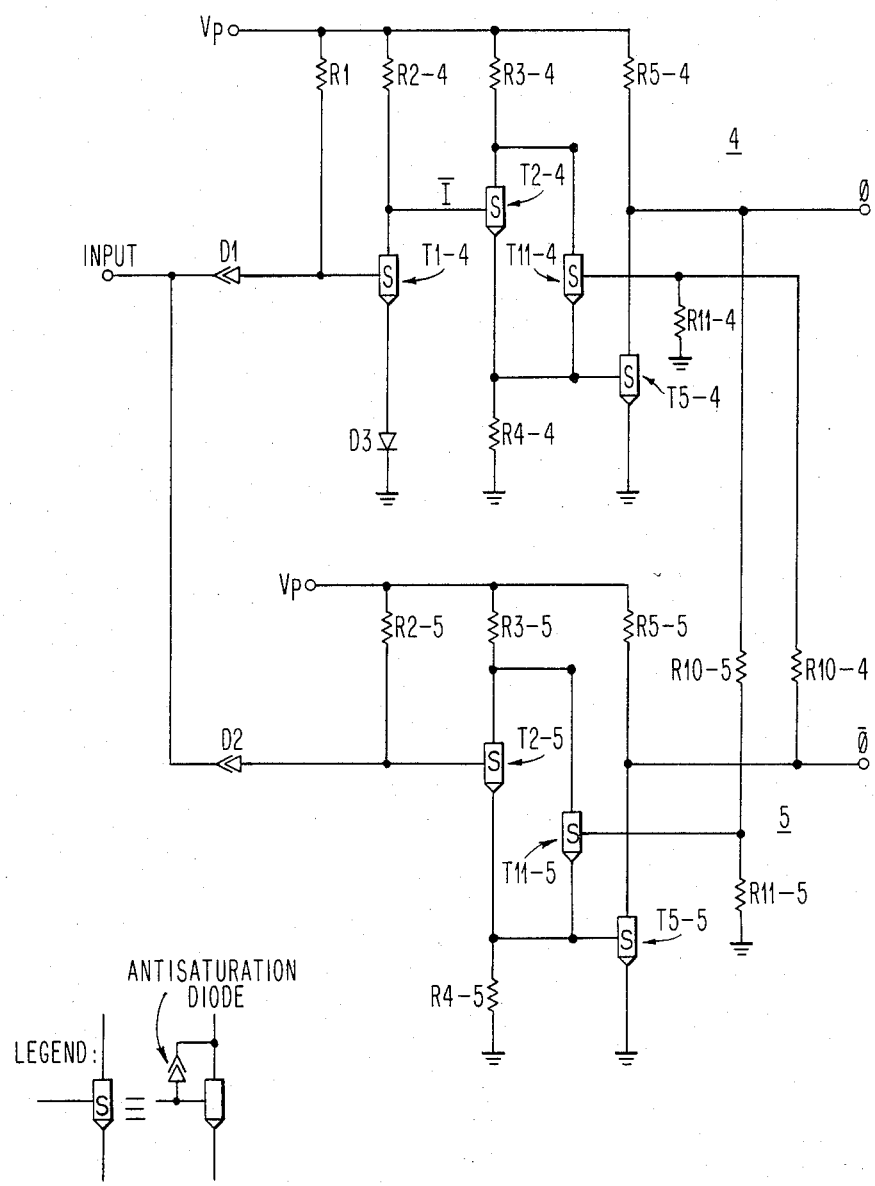
FIG. 4 shows another possible embodiment of a true/complement generator in accordance with the invention.

The power dissipated by this additional transistor can be neglected when compared to the important transient power which is saved in the decoder and in the array controlled by this decoder The principle of this circuit can also be applied to not "push-pull" circuits an embodiment of which is shown in FIG. 4, as an example.

The circuit shown in FIG. 4 comprises two circuits 4 and 5, the first one providing true output $\phi$ and the second one providing complement output $\bar{\phi}$.

Circuits 4 and 5 are comprised of devices similar to the ones of circuits 1 and 2. Therefore, they are provided with the same reference numbers to which suffixes 4 and 5 are respectively added. The arrangement of output transistors T5-4 and T5-5 is different since the collectors thereof are connected to the biasing voltage through resistors R5-4 and R5-5, respectively.

The arrangement of transistors T11-4 and T11-5 the bases of which are driven by the voltage taken from the common node of resistors R10-4, R11-4 and R10-5, R11-5, provides a result similar to the one obtained in the circuit of FIG. 3.

In a preferred embodiment of this invention, the selection of a chosen word line implies that the corresponding address bits applied to the input, switch off the diodes associated with said line in the array, i.e. the selection is ensured by the rising edge of $\phi$ or $\bar{\phi}$ according to the line which has been chosen. It is the reason why delay control transistors T11-1 and T12-2 delay the appearance of the rising edge on $\bar{\phi}$ when a falling edge is applied to the input, and the appearance of the rising edge on $\phi$ when a rising edge is applied to the input.

It is obvious that in the inverse case, it would be necessary to modify the arrangement by using transistors of opposite conductivity in order to delay the selection.

While the invention has been shown and described with reference to a preferred embodiment thereof it will be understood by those skilled in the art that various changes in form and details may be made therein without departing from the spirit and scope of the invention.

We claim:

1. A true/complement generator, said true/complement generator comprising:
   an input terminal for receiving a binary input;
   a true output terminal for providing a true binary output of said binary input;
   a complement output terminal for providing a complementary binary output of said binary input;
   first, second and third through ninth transistors, each of said first, second and third through ninth transistors having an emitter, base and collector;
   a first diode connected between said input terminal and said base of said first transistor;
   a second diode connected between said input terminal and said base of said sixth transistor;
   a first resistor connected between said base of said first transistor and a first source of potential;
   a second resistor connected between said first source of potential and a common connection of said collector of said first transistor and said base of said second transistor;
   a third diode connected between said emitter of said first transistor and a second source of potential;
   a third resistor connected between said first source of potential and a common connection of said collector of said second transistor, said collector of said fourth transistor and said base of said third transistor;
   a fourth resistor connected between said second source of potential and a common connection of said emitter of said second transistor, said emitter of said fourth transistor and said base of said fifth transistor;
   a fourth diode connected between said emitter of said third transistor and said collector of said fifth transistor;
   a direct connection between said collector of said third transistor and said first source of potential;
   a direct connection between said emitter of said fifth transistor and said second source of potential;
   a sixth resistor connected between said base of said sixth transistor and said first source of potential;
   a seventh resistor connected between said first source of potential and a common connection of said collector of said sixth transistor, said base of said seventh transistor and said collector of said eighth transistor;
   an eighth resistor connected between said second source of potential and a common connection of said emitter of said sixth transistor, said emitter of said eighth transistor and said base of said ninth transistor;
   a fifth diode connected between said emitter of said seventh transistor and said collector of said ninth transistor;
   a direct connection between said collector of seventh transistor and first source of potential;
   a direct connection between said emitter of said ninth transistor and said second source of potential;
   a fifth resistor connected between said base of said fourth transistor and said second source of potential;
   an eleventh resistor connected between said base of said eighth transistor and said second source of potential;
   a ninth resistor connected between said true output terminal and said base of said eighth transistor;
   a tenth resistor connected between said complement output terminal and said base of said fourth transistor;
   a direct connection between said true output terminal and said emitter of said third transistor; and
   a direct connection between said complement output terminal and said emitter of said seventh transistor.

2. A true/complement generator, said true/complement generator comprising:
   an input terminal for receiving a binary input;
   a true output terminal for providing a true binary output of said binary input;
   a complementary output terminal for providing a complementary binary output of said binary input;
   first, second and third through seventh transistors, each of said first, second and third through seventh transistors having an emitter, base and collector;
   a first diode connected between said input terminal and said base of said first transistor;
   a second diode connected between said input terminal and said base of said fifth transistor;
   a first resistor connected between said base of said first transistor and a first source of potential;
   a second resistor connected between said first source of potential and a common connection of said collector of said first transistor and said base of said second transistor;
   a third diode connected between said emitter of said first transistor and a second source of potential;
   a third resistor connected between said first source of potential and a common connection of said collector of said second transistor and said collector of said third transistor;
   a fourth resistor connected between said second source of potential and a common connection of said emitter of said second transistor, said emitter of said third transistor and said base of said fourth transistor;
   a fifth resistor connected between said first source of potential and said collector of said fourth transistor;
   a direct connection between said emitter of said fourth transistor and said second source of potential;
   a seventh resistor connected between said base of said fifth transistor and said first source of potential;
   an eighth resistor connected between said first source of potential and a common connection of said collector of said fifth transistor and said collector of said sixth transistor;
   a ninth resistor connected between said second source of potential and a common connection of said emitter of said fifth transistor, said emitter of said sixth transistor and said base of said seventh transistor;
   a tenth resistor connected between said first source of potential and said collector of said seventh transistor;
   a direct connection between said emitter of said seventh transistor and said second source of potential;
   a sixth resistor connected between said base of said third transistor and said second source of potential;

a thirteenth resistor connected between said base of said sixth transistor and said second source of potential;
an eleventh resistor connected between said base of said sixth transistor and said true output terminal;
a twelfth resistor connected between said base of said third transistor and said complementary output terminal;
a direct connection between said true output terminal and said collector of said fourth transistor; and
a direct connection between said complementary output terminal and said collector of said seventh transistor.

* * * * *